United States Patent

Husni

[15] 3,668,770

[45] June 13, 1972

[54] METHOD OF CONNECTING SEMICONDUCTOR DEVICE TO TERMINALS OF PACKAGE

[72] Inventor: Saleem Ynees Husni, Menham Township, Morris County, N.J.

[73] Assignee: RCA Corporation

[22] Filed: May 25, 1970

[21] Appl. No.: 39,989

[52] U.S. Cl. ..............................29/423, 29/471.1, 29/471.3, 29/475, 29/482

[51] Int. Cl. ..............................B23p 17/00

[58] Field of Search ..............................29/471.1, 471.3, 626, 423, 29/475, 482

[56] References Cited

UNITED STATES PATENTS

| | | | |
|---|---|---|---|
| 3,024,151 | 3/1962 | Robinson | 29/626 |
| 3,371,148 | 2/1968 | Roques et al. | 29/626 X |
| 3,374,537 | 3/1968 | Doelp, Jr. | 29/471.1 X |
| 3,440,027 | 4/1969 | Hugle | 29/627 X |
| 3,469,684 | 9/1969 | Keady | 29/626 X |
| 3,544,857 | 12/1970 | Byrene et al. | 29/627 X |
| 3,575,822 | 4/1971 | Limbourg | 29/626 |

*Primary Examiner*—John F. Campbell
*Assistant Examiner*—Richard Bernard Lazarus
*Attorney*—Glenn H. Bruestle

[57] ABSTRACT

The contacts of a semiconductor device are connected to the terminals of a package for the semiconductor device through metal interconnecting strips. The strips are formed on the surface of a plate from which the strips can be easily pulled away. The semiconductor device is seated on the plate with each contact of the semiconductor device engaging a separate one of the strips and the semiconductor device contacts are bonded to the strips. The terminals, which are connected to a frame, are placed in contact with and bonded to the strips. The assembly of the terminals, interconnecting strips and semiconductor device is then removed from the plate. A package is formed around the assembly with the terminals projecting from the package.

4 Claims, 5 Drawing Figures

INVENTOR.
Saleem Y. Husni
BY
Donald S. Cohen
ATTORNEY

METHOD OF CONNECTING SEMICONDUCTOR DEVICE TO TERMINALS OF PACKAGE

BACKGROUND OF INVENTION

The present invention relates to a method of connecting terminals to the contacts of a semiconductor device.

To protect semiconductor devices from adverse effects of the environment, it is the practice to encapsulate the devices in a protective package. The package includes terminals which are electrically connected at one end to the contacts of the semiconductor device and project from the package. To permit the terminals of the package to be connected to other electrical components in a circuit, either directly or to a printed circuit board, the terminals are relatively thick, large and coarsely spaced as compared to the size of the semiconductor device and resolution of the contacts of the device. Therefore, the terminals are too large to be electrically connected directly to the contacts of the semiconductor device, but must be connected through an intermediate connecting means which is small enough to be connected directly to the contacts of the semiconductor device and which is contained in the package.

One method which has been used to connect the contacts of the semiconductor device to the terminal is by fine wires, usually having a diameter of about 1 mil, which are bonded at one end to the contacts and at the other end to the terminals. However, making the interconnection by fine wires is a time consuming and expensive operation since it must be done either manually or semi-manually. This is particularly so when the semiconductor device is an integrated circuit having a large number of contacts which must be individually connected to separate terminals.

Another method which has been used to make the connections between the semiconductor device contacts and the terminals is by an interconnecting means which comprises a flat plate of an electrical insulating material having a plurality of metal strips coated on and bonded to a surface of the plate. The metal strips are arranged in a pattern with one end of each strip extending to a central location on the plate and the other end of each strip extending to an edge of the plate. The semiconductor is mounted on the plate at the central location with the contacts of the device engaging and being bonded to the strips. The terminals are bonded to the ends of the strips at the edge of the plate and project from the edges of the plate. The assembly of the terminals, interconnecting plate and semiconductor device is then encapsulated in a package. Although this technique reduces the labor time and cost of making the interconnections, it has the disadvantage that it increases the overall materials cost and increases the size and weight of the finished package. Therefore, it is desirable to have a means of interconnecting the terminals and the semiconductor device which is not only easy to assemble, but also does not add to the cost of the materials or the size of the finished package.

SUMMARY OF INVENTION

Terminals are connected to contacts on a body of semiconductor material by forming on a surface of a master plate a plurality of spaced metal strips with the strips being poorly adhered to the plate. The semiconductor body is secured to the strips with each of the contacts on the body being bonded to a separated one of the strips. A separate metal terminal is bonded to each of the strips. The strips with the connected terminals and semiconductor body is then removed from the plate.

DETAILED DESCRIPTION

In general, the method of the present invention for connecting terminals to the contacts on a semiconductor device comprises first forming a plurality of interconnecting strips of an electrically conductive metal on the surface of a master plate. The surface of the master plate is of a material on which the interconnecting strips can be readily coated but which will have poor adhesion with the metal of the connecting strips. Suitable materials for the surface of the master plate include graphite, stainless steel, a metal which has an adherent oxide film, such as titanium, niobium or aluminum, or a plastic which is poorly wettable, such as the fluorocarbon resins. The strips are arranged with one end of each strip being adjacent a common point on the master plate and with the strips extending away from the common point toward the edges of the master plate. The semiconductor device is seated on the master plate at the common point with each of the contacts of the semiconductor device engaging a separate one of the strips. The terminals are placed on the plate with one end of each of the terminals engaging the other end of a separate one of the strips. The terminals and the contacts of the semiconductor device are bonded to their respective strips using any well known bonding technique, such as soldering, thermocompression bonding or ultrasonic bonding. The assembly of the terminals, interconnecting strips and semiconductor device is then separated from the master plate by peeling the interconnecting strips from the plate. The assembly can then be encapsulated in a package, and the master plate can be used to form another assembly.

Figure 1:
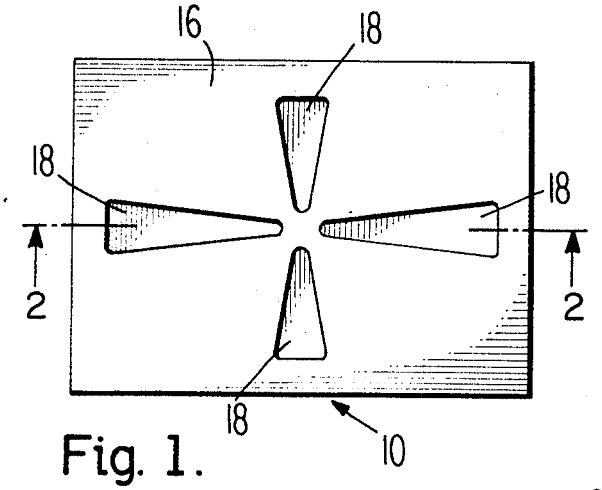
FIG. 1 is a top plan view of the master plate used in the method of the present invention.
Figure 2:
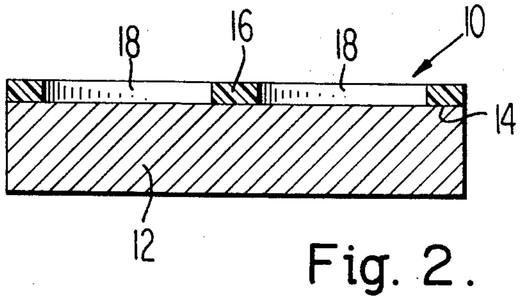
FIG. 2 is a sectional view of the master plate taken along line 2—2 of FIG. 1.

Referring to FIGS. 1 and 2, a form of the master plate which can be used to carry out the method of the present invention is generally designated as 10. The master plate 10 comprises a body 12 having a flat surface 14. A masking layer 16 extends over and is bonded to the surface 14 of the body 12. The masking layer 16 has a plurality of openings 18 therethrough. The openings 18 are of a shape and are arranged to correspond with the shape and the arrangement of the interconnecting strips to be formed on the master plate 10. The body 12 is of a material which has poor adhesion to the metal of the interconnecting strips. For example, the body 12 can be made of graphite, stainless steel, a metal which has an adherent oxide film, such as titanium, niobium or aluminum, or a plastic which is poorly wettable, such as the fluorocarbon resins. The body 12 can be made entirely of one of these materials or can be a substrate of some other material, such as any metal or plastic, which is coated with one of these materials. The material of the body 12 must also be compatible with the manner that the interconnecting strips are to be formed on the surface of the body. For example, if the interconnecting strips are to be formed by electroplating, the body 12, or at least the surface of the body, must be of one of the materials which is electrically conductive. The masking layer 16 is of an electrically insulating material, such as a plastic or a thick film of such oxides as silicon oxide or aluminum oxide. The material of the masking layer 16 must also be compatible with the method used for forming the interconnecting strips on the master plate. For example, if the interconnecting strips are formed by electroplating, the material of the masking layer must be capable of withstanding attack from the particular electrolyte used in the plating bath.

Figure 3:
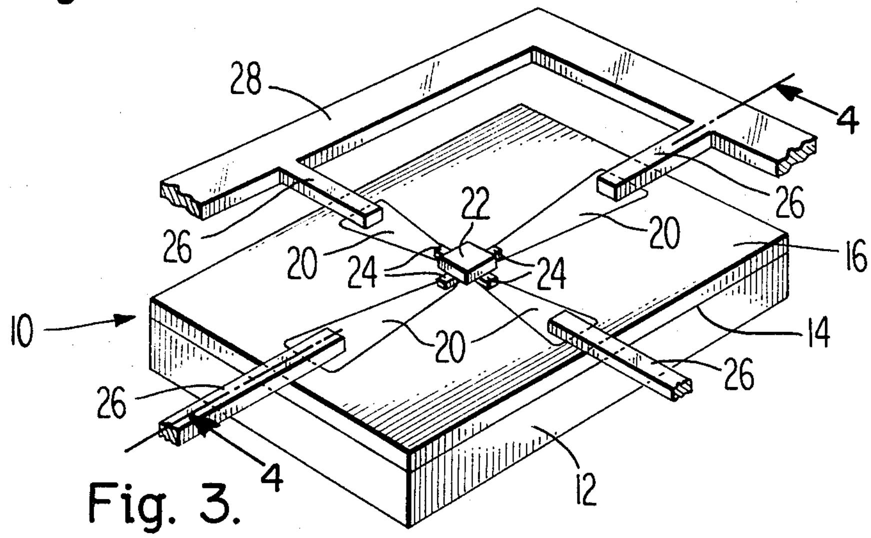
FIG. 3 is a perspective view, partially broken away, showing the interconnecting method of the present invention.
Figure 4:
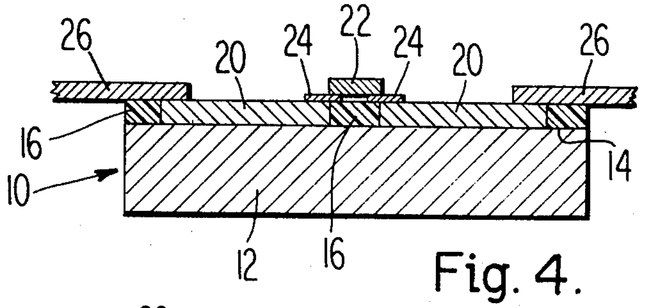
FIG. 4 is a sectional view taken along line 4—4 of FIG. 3.

Referring to FIGS. 3 and 4, there is shown the method of the present invention for connecting the contacts of a semiconductor device to terminals using the master plate 10. The portions of the surface 14 of the body 12 exposed in the openings 18 in the masking layer 16 are coated with a film of an electrically conductive metal to form interconnecting strips 20. The interconnecting strips 20 can be formed on the master plate 10 by any well known coating technique, such as electroplating, electroless plating or evaporation in a vacuum. Electroplating is preferred since it is the simplest method of forming the interconnecting strips of the desired thickness only on the exposed portions of the surface 14. Since the masking layer 16 is non-conducting, the metal film will be deposited only on the exposed portions of the surface of the conducting body 12. If electroless plating is used, only the exposed portions of the surface 14 are treated with the sensitizing solution. If evaporation in a vacuum is used, the deposition of the metal film can be done through a removable mask so as to limit the deposition to the exposed portion of the body surface. The interconnecting strips 20 can be made of any desired electrically conductive metal. However, gold, nickel or a gold layer over a nickel layer are the metals which are preferred. The interconnecting strips 20 are of a thickness so as to be self-supporting, such as approximately 0.5 mil. As shown, the interconnecting strips 20 can be tapered in width with the ends which are to be connected to the small contacts of the semiconductor device being narrow and the ends which are to be connected to the layer terminals being wider.

The semiconductor device 22 is seated on the master plate 10 at the space between the adjacent narrow ends of the interconnecting strips 20. The semiconductor device 22 comprises a body of semiconductor material having one or more active devices formed therein and contacts 24 on a surface of the semiconductor body. As shown, the contacts 24 are beam lead type contacts which project beyond the edges of the semiconductor body. However, semiconductor devices having other types of contacts can also be used. The number and arrangement of the interconnecting strips 20 correspond to the number and arrangement of the contacts 24 of the semiconductor device 22. Thus, when the semiconductor device 22 is seated on the master plate 10, it can be positioned with each of the contacts 24 engaging the narrow end of a separate one of the interconnecting strips 20. The contacts 24 are then bonded to their respective interconnecting strips 20 using any type of bonding technique, such as soldering, thermocompression bonding or ultrasonic bonding.

The terminals 26 are placed on the master plate 10 with an end of each of the terminals overlapping and engaging the wider end of a separate one of the interconnecting strips 20. As shown, the terminals 26 are all connected to a frame 28 to permit ease of handling the terminals. The number and position of the terminals 26 on the frame 28 corresponds to the number and position of the interconnection strips 20. Thus, when the frame 28 with the integral terminals 26 is placed over the master plate 10, all of the terminals 26 can be simultaneously placed into engagement with their respective interconnecting strips 20. The terminals 26 are then bonded to their respective interconnecting strips 20 in the same manner that the semiconductor device contacts 24 are bonded to the interconnecting strips. If desired, the semiconductor device contacts 24 can be bonded to the interconnecting strips 20 at the same time that the terminals 26 are bonded to the interconnecting strips.

Figure 5:
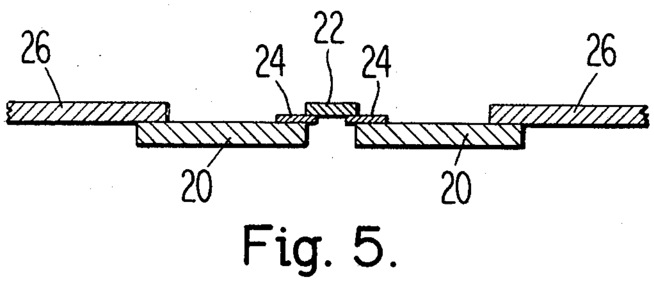
FIG. 5 is a sectional view of the completed interconnected assembly.

The assembly of the terminals 26, connecting strips 20 and semiconductor device 22 is then removed from the mater plate 10. Since the interconnecting strips 20 are poorly adhered to the surface 14 of the master plate body 12, the interconnecting strips can be easily peeled from the surface 14 to remove the assembly from the master plate. As shown in FIG. 5, this provides an assembly in which the contacts 24 of the semiconductor device 22 are connected to the terminals 26 by self-supporting interconnecting strips 20. The assembly can then be encapsulated in a package. The package can be, e.g., either a plastic body molded around the semiconductor device 22, interconnecting strips 20 and portions of the terminals 26, or a ceramic package which encloses the assembly with the terminals 26 projecting therefrom. After the assembly is encapsulated in the package, the terminals 26 can be severed from the frame 28. Once the assembly is removed from the master plate 10, the master plate can be reused to form another assembly in the manner described above.

Since the interconnecting strips 20 are formed on the master plate 10 in an arrangement corresponding to the semiconductor device contacts and the terminals are secured to the interconnecting strips on the master plate, the connection of the semiconductor device contacts to the terminals can be performed quickly and easily. Also, since the semiconductor device contacts are connected to the terminals only by the relatively thin, self-supporting interconnecting strips, the final assembly is made up of a minimum number of parts so as to be relatively inexpensive, and can be encapsulated in a small package. In addition, since the master plate is reusable to form a large number of the assemblies, it adds little, if anything, to the overall cost of making the assembly. Thus, there is provided a method of connecting the contacts of a semiconductor device to terminals which can be easily and quickly performed and which provides an assembly which is small in size and is made up of a minimum number of parts.

I claim:

1. A method of making connections to a body of semiconductor material having a plurality of contacts on a surface of the body comprising:

a. providing a master plate which comprises a body having a flat surface and a masking layer covering and adhered to said surface and having a plurality of spaced openings therethrough b. forming on the surface of the body of the master plate within each of the openings in the masking layer strips of an electrically conductive metal having a thickness of about 0.5 mil, c. securing said semiconductor body to said strips with each of the contacts on said semiconductor body being bonded to a separate one of said strips, d. bonding metal terminals to said strips, and then e. peeling said strips from the surface of the master plate body so as to remove said strips and the connected terminals and semiconductor body from said plate with said making layer remaining adhered to said surface of the master plate body.

2. A method in accordance with claim 1 in which the strips are formed on the master plate with one end each of the strips being adjacent a common point on said master plate and the semiconductor body is seated on the master plate at said common point with each of the contacts engaging a separate one of the strips at the one end of the strip.

3. A method in accordance with claim 2 in which the number and arrangement of the strips formed on the master plate corresponds to the number and arrangement of the contacts of the semiconductor body.

4. A method in accordance with claim 3 in which the surface of the body of the master plate is of an electrically conductive material, the masking layer is of an electrical insulating material, and the strips are formed on said surface by electroplating.

* * * * *